(12) United States Patent
Aoki et al.

(10) Patent No.: US 6,472,229 B1
(45) Date of Patent: Oct. 29, 2002

(54) METHOD FOR MANUFACTURING A FERROELECTRIC CAPACITOR HAVING IMPROVED POLARIZATION CHARACTERISTICS AND A METHOD FOR MANUFACTURING A FERROELECTRIC MEMORY DEVICE INCORPORATING SUCH CAPACITOR

(75) Inventors: Katsuhiro Aoki, Tsuchiura; Yukio Fukuda, Tohkai-mura, both of (JP); Ken Numata, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/092,686

(22) Filed: Jun. 5, 1998

(30) Foreign Application Priority Data

Jun. 6, 1997 (JP) ............................................. 9-164997

(51) Int. Cl.$^7$ ............................................. H01L 21/00
(52) U.S. Cl. ............................ 438/3; 438/239; 438/240
(58) Field of Search ............................ 438/3, 240, 239

(56) References Cited

U.S. PATENT DOCUMENTS 5,348,775 A * 9/1994 Lin

OTHER PUBLICATIONS

Hendrickson et al. Processing of PZT TF for MEM Systems, IEEE, pp. 683–686, 1996.*
Kneer et al., Effects of Sol–Gel PZT Film Thickness and Electrode Structure on the Elec. Behavior of Pt/PZT/Pt Capacitors, (IEEE), pp. 446–449, 1995.*
VLSI Fabrication Principles (Silicon and Gallium Arsenide), 2nd Edition, pp. 639–643, (1994).*

* cited by examiner

Primary Examiner—Long Pham
Assistant Examiner—Scott Brairton
(74) Attorney, Agent, or Firm—William B. Kempler; Frederick J. Telecky, Jr.; W. James Brady (57) ABSTRACT

The purpose of this invention is to provide a method for manufacturing capacitors free of polarization fatigue even when the treatment is performed at a low temperature.

Amorphous layer 32 made of lead zirconate titanate and containing excess lead is formed on lower electrode 13 made of iridium. The amorphous layer is crystallized by a heat treatment to form PZT film 14. Structural transition layer 33 containing excess Pb formed on the surface of PZT film 14 during the aforementioned crystallization is removed by means of dry etching. In this way, a PZT capacitor is obtained.

19 Claims, 10 Drawing Sheets

STEP 1: FORMATION OF THE AMORPHOUS PZT FILM

FIG. 1A

STEP 2: HEAT TREATMENT FOR CRYSTALLIZING PZT

FIG. 1B

STEP 3: REMOVAL OF THE STRUCTURAL TRANSITION LAYER FROM THE SURFACE

FIG. 1C

AFTER THE SURFACE LAYER IS REMOVED

FIG. 1D

STEP 4: FORMATION OF THE UPPER ELECTRODE

FIG. 1E

STEP 5: PATTERNIZATION OF THE CAPACITOR, FORMATION OF THE INSULATING LAYER, AND WIRING

WITHOUT STRUCTURAL TRANSITION LAYER (INTERFACE LAYER)

FIG. 5B

WITH STRUCTURAL TRANSITION LAYER (INTERFACE LAYER)

METHOD FOR MANUFACTURING A FERROELECTRIC CAPACITOR HAVING IMPROVED POLARIZATION CHARACTERISTICS AND A METHOD FOR MANUFACTURING A FERROELECTRIC MEMORY DEVICE INCORPORATING SUCH CAPACITOR

DETAILED EXPLANATION OF THE INVENTION

1. Industrial Application Field

This invention pertains to a method for manufacturing ferroelectric capacitors (especially ferroelectric capacitors with a lead zirconate titanate (PZT) film) and a method for manufacturing ferroelectric memory devices (especially nonvolatile semiconductor memories using the ferroelectric capacitor with a PZT film).

2. Prior Art

By forming a capacitor using a film made of PZT, a ferroelectric material, as the dielectric film, it is possible to manufacture a nonvolatile memory element having a simple configuration and using the remnant polarization characteristics of the capacitor, that is, a ferroelectric RAM (ferroelectric random access memory) known as a nonvolatile memory called FRAM.

In the conventional FRAM, however, the so-called "polarization fatigue" phenomenon, which will significantly deteriorate the polarization characteristics, tends to occur because the inversion (that is, the polarization inversion performed when data are written or read) is repeated during the operation of the PZT capacitor Cap. This phenomenon causes problems in developing practical devices. When the inversion is repeated about 1,000,000 times, the polarization intensity is reduced to about half of the original value or even less. Consequently, it has been difficult to develop devices with high reliability for repeated reading or writing operation.

Progress for Achieving this Invention

In Japanese Patent Application No. Hei 8[1996]-181358, the present inventors have already proposed a novel effective method (referred to as the previous invention hereinafter) that can alleviate the aforementioned polarization fatigue under two conditions. According to the previous invention, the first condition is to use and crystallize a PZT feed solution (used when forming a film by the sol-gel method) containing excess lead at a temperature higher than 650° C. The second condition is to use electrodes made of Ir, Ru, or other oxidizing metals.

The aforementioned first condition will be explained as follows. When amorphous PZT is deposited on a lower electrode made of Ir and is heated to a temperature higher than the crystallization temperature, crystallization is carried out in the thickness direction. A columnar grain structure is formed during the crystallization process, and the excess lead is pressed out to the surface to form a structural transition layer mainly composed of the Pb on the surface of the PZT layer.

In this case, the composition of a preferred PZT precursor solution is such that Pb=1.02–1.50 (with respect to Zr+Ti=1.0) (the ratio of Ti/Zr can be selected at will). If the Pb concentration is too low, it is difficult to form the aforementioned columnar structure (control of the PZT crystallization direction). On the other hand, if the Pb concentration is too high, the aforementioned structural transition layer becomes too thick to be removed by heat treatment.

When the sintering temperature in the heat treatment is too low (600° C.), it is easy to form the aforementioned structural transition layer mainly composed of Pb. On the other hand, the structural transition layer will disappear if the sintering temperature is controlled to 650° C. or higher. However, if the sintering temperature is too high, it is difficult to form the PZT crystal. Consequently, the sintering temperature should be maintained at 750° C. or lower.

As far as the sintering (annealing) temperature for PZT is concerned, for the PZT formed at 600° C., the remnant polarization intensity is almost reduced to 0 after 100,000,000 polarization inversions. On the other hand, the polarization characteristics of the capacitor formed at 650° C. are improved significantly. Also, the remnant polarization intensity of a sample formed at a temperature in the range of 650–700° C. is barely reduced after 100,000,000 inversions. The reason for the improvement in the fatigue characteristic property is that the structural transition layer made of the excess pB on the surface disappears at a temperature of 650° C. or higher.

In the following, the electrode material as the aforementioned second condition will be explained. Generally, Pt or another substance that cannot be oxidized is used for the electrodes of the PZT capacitor (in some cases, however, Au is used for the upper electrode alone). The previous invention has succeeded in alleviating the polarization fatigue by using metal Ir for both the lower and upper electrodes. For example, the polarization characteristics of acapacitor using Pt for its electrodes deteriorate significantly when the inversion is repeated more than $2 \times 10^8$ times. On the other hand, when Ir is used for the electrodes, deterioration in the polarization characteristics does not occur until the inversion is repeated $2 \times 10^9$ times.

As described above, the polarization fatigue characteristic property has a strong dependency on the material of the electrodes. Compared with other types of capacitors, the capacitor with both upper and lower electrodes made of Ir has a very stable remnant polarization intensity (Pr) during the polarization inversion. It is believed that the reason for the stable remnant polarization intensity is due to the oxidizability of the Ir metal.

Problems to be Solved by the Invention

While the previous invention has the aforementioned desirable features, there is still a problem remaining to be solved. That is, in a manufacturing process that satisfies the aforementioned conditions, it is difficult to keep the temperature low because the temperature (sintering temperature) for forming the PZT has to be kept at the level of 650° C. or higher.

When the temperature is high, the element region and wiring on the semiconductor substrate will be affected by the generated heat. For example, a change in the concentration of the impurities or damage of Al wiring might occur.

The purpose of this invention is to provide a method that can take advantage of the features of the previous invention and can also be used to manufacture capacitors free of polarization fatigue, even when the treatment is carried out at a low temperature.

Means to Solve the Problems

This invention provides a method for manufacturing a ferroelectric capacitor characterized by the fact that the process for forming the ferroelectric capacitor by sequentially laminating a ferroelectric film and a first electrode on a second electrode (for example, the process for forming the ferroelectric capacitor by sequentially laminating a lead zirconate titanate layer and an upper electrode made of iridium, iridium oxide, rubidium, rubidium oxide, platinum, or palladium on a lower electrode made of iridium, iridium oxide, rubidium, rubidium oxide, platinum, or palladium) has the following steps:

- a step in which a ferroelectric material layer containing an excess amount of the specific constituent element of the aforementioned ferroelectric film is formed on the aforementioned first electrode (for example, a step in which an amorphous layer of lead zirconate titanate containing excess lead is formed on the aforementioned lower electrode);
- a step in which the aforementioned ferroelectric material is crystallized by a heat treatment to form the aforementioned ferroelectric film (for example, a step in which the aforementioned amorphous layer is crystallized by a heat treatment to form a crystal layer of lead zirconate titanate);
- a step in which the surface deposit mainly composed of the aforementioned specific constituent element and generated on the surface of the aforementioned ferroelectric film during the crystallization process is removed (for example, a step in which the surface deposit mainly made of the excess lead and generated on the surface of the aforementioned crystal layer during the crystallization process is removed by means of etching or dissolution); and
- a step in which the aforementioned upper electrode is formed on the aforementioned crystal layer exposed after the aforementioned surface deposit is removed.

This invention also provides a method for manufacturing a ferroelectric memory device characterized by the fact that the ferroelectric capacitor in a memory cell is formed using the aforementioned method.

According to this invention, a ferroelectric material layer, such as an amorphous layer made of lead zirconate titanate containing an excessive amount of the specific constituent element of the aforementioned ferroelectric film, such as lead, is formed on the aforementioned first electrode. Then, the ferroelectric material is crystallized by a heat treatment to form the aforementioned ferroelectric film. After that, the surface deposit, such as the aforementioned structural transition layer made of the excess pB, mainly composed of the aforementioned specific constituent element and generated on the surface of the aforementioned ferroelectric film during the crystallization process, is removed. Consequently, even when the aforementioned heat treatment is performed at a low temperature (especially 600° C. or below), the deterioration in the polarization fatigue characteristic caused by the surface deposit can be prevented because the generated surface deposit is removed by the aforementioned heat treatment. In-addition, by using the material layer containing an excessive amount of the specific constituent element, such as Pb, the crystallization can be carried out in the desired direction to form a ferroelectric film with a good polarization inversion characteristic.

Since it becomes possible to perform the heat treatment at a low temperature, the influence of the heat on the element region and wiring of the semiconductor substrate can be minimized. Consequently, the change in the concentration of the impurities and the damage of Al wiring can be prevented.

In the method of this invention, the aforementioned surface deposit can be removed by means of dry etching or chemical dissolution performed after the surface deposit is vitrified. When the aforementioned surface deposit is removed by means of dry etching, it is preferred that a heat treatment be performed at 400–700° C. after the dry etching operation to recover from damage to the ferroelectric film caused by dry etching.

When the aforementioned amorphous layer containing excess pB is used as the material of the ferroelectric film, it is preferred that the content of lead in the aforementioned amorphous layer made of lead zirconate titanate be 1.02–1.50 times (in the ratio of number of atoms) as much as the total amount of zirconium and titanium. It is preferred that the aforementioned heat treatment be performed at a low temperature of 600° C. or below.

In the method of this invention, in order to simplify the manufacturing process, it is preferred to form an insulating layer on the surface of the substrate before the aforementioned surface deposit is removed. After the prescribed portions of the aforementioned insulating layer are removed, the aforementioned surface deposit right below the removed portions is removed to expose part of the aforementioned ferroelectric film.

In this case, the prescribed portions of the aforementioned insulating layer on the surface of the substrate and the aforementioned surface deposit below the prescribed portions can be removed by means of etching or dissolution using a common mask. The aforementioned upper electrode is formed on the exposed crystal layer. The aforementioned insulating layer and surface deposit can be removed by means of dry etching or chemical dissolution performed after the surface deposit is vitrified.

After the dry etching operation, it is preferred that a heat treatment be performed at a temperature in the range of 400–700° C. to recover from damage caused by the dry etching.

It is preferred that the content of lead in the aforementioned amorphous layer made of lead zirconate titanate be 1.02–1.50 times (in the ratio of number of atoms) as much as the total amount of zirconium and titanium. In addition, it is preferred that the aforementioned heat treatment be performed at a low temperature of 600° C.

BRIEF DESCRIPTION OF FIGURES

FIG. 1

FIG. 2

FIG. 3

FIG. 4

FIG. 5

FIG. 6

FIG. 7

FIG. 8

FIG. 9

FIG. 10

FIG. 11

FIG. 12

FIG. 13

FIG. 14

FIG. 15

FIG. 16

| | |
|---|---|
| 1A, 1B, 1C | Insulating layers |
| 8 | $N^+$-type drain region |
| 9 (WL) | Word line |
| 10 | $N^+$-type source region |
| 13 | Lower Ir electrode |
| 14 | Ferroelectric film (PZT film) |
| 15 | Upper Ir electrode |
| 16 (BL) | Bit line |
| 17 | Silicon substrate |
| 20 | Polysilicon plug |
| 22 | Plasma |
| 30 | Barrier layer |
| 32 | Amorphous PZT layer |
| 33 | Structural transition layer |
| CAP | Ferroelectric capacitor |
| TR | Transfer gate |
| M-CEL | Memory cell |

EMBODIMENTS

In the following, the method of this invention will be explained in more detail.

When a solution containing excess lead is used to form a PZT film with a perovskite crystal structure at a low temperature of 600° C. or below, after the structural transition layer containing excess pB and formed on the PZT film is removed by means of dry etching, an upper electrode is formed on the PZT film. In this way, a ferroelectric capacitor free of polarization fatigue can be formed.

Figure 1A:
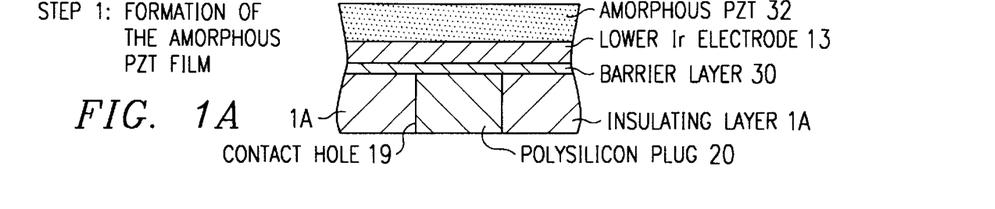
FIG. 1 is a schematic cross-sectional view illustrating the process for forming a PZT capacitor according to this invention.
Figure 1B:
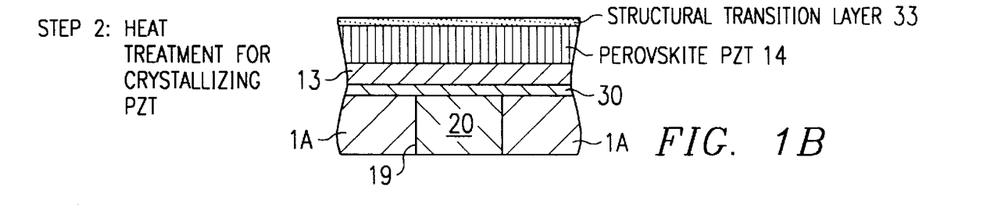
Figure 1C:
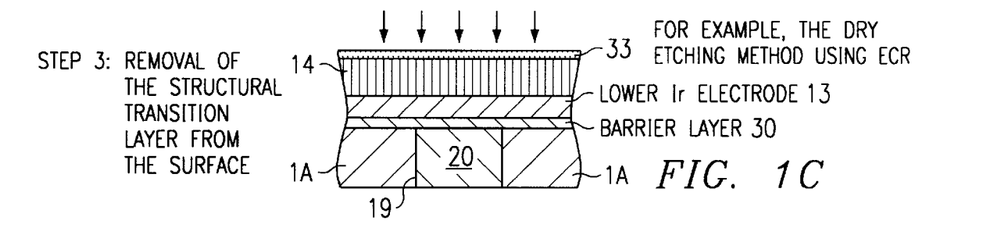
Figure 1D:
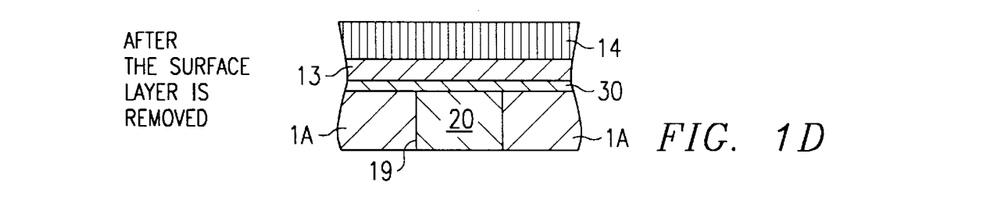
Figure 1E:
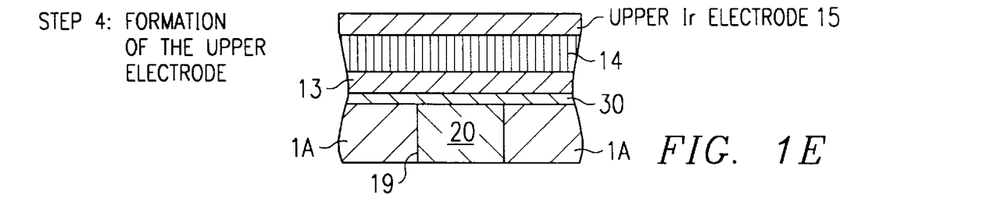
Figure 1F:
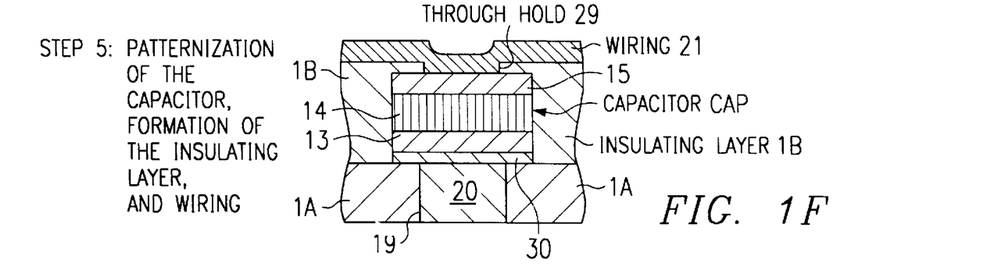
Figure 2A:
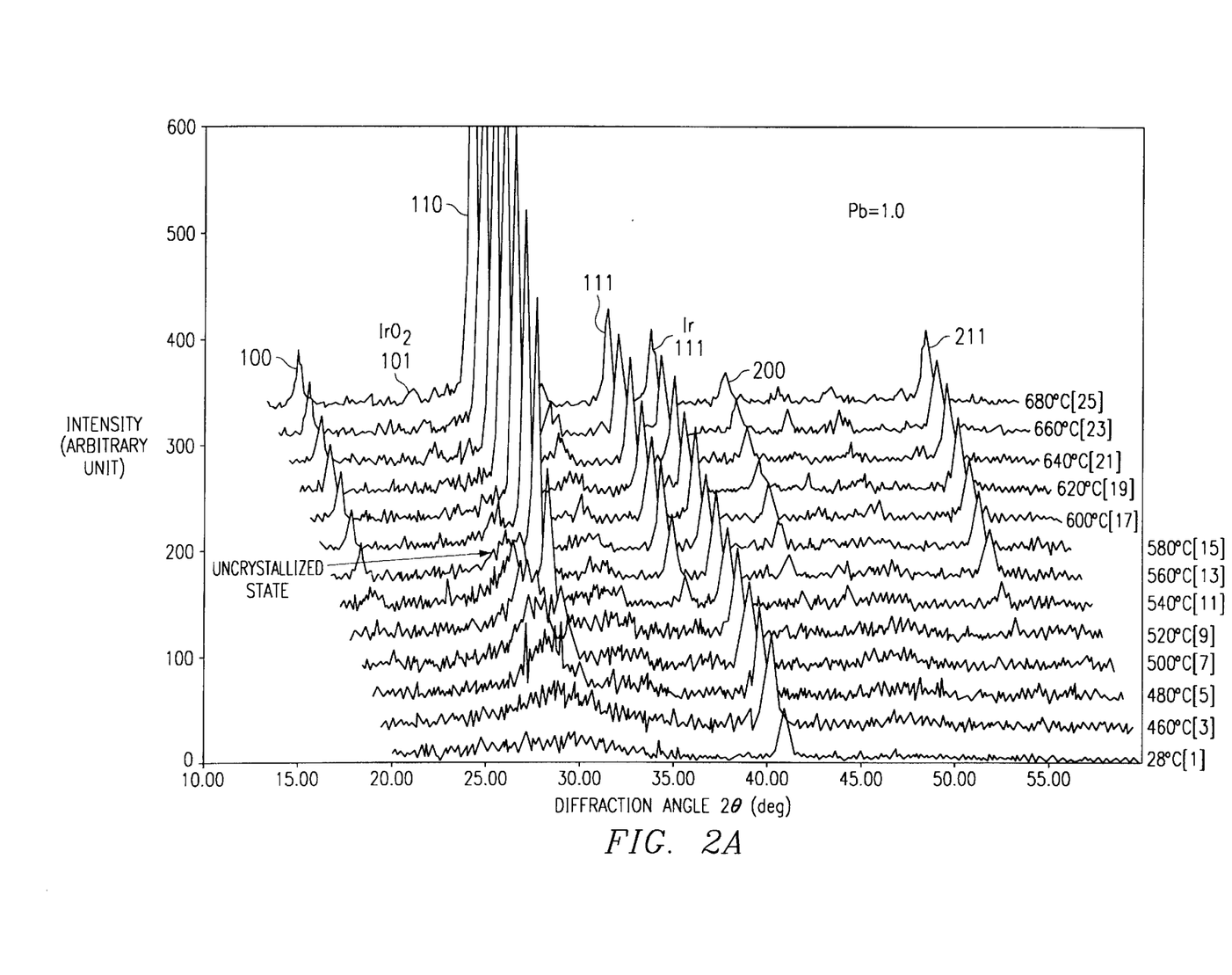
FIG. 2 is a diagram illustrating the X-ray diffraction spectra of PZT depending on the temperature of the heat treatment for different Pb concentrations.
Figure 2B:
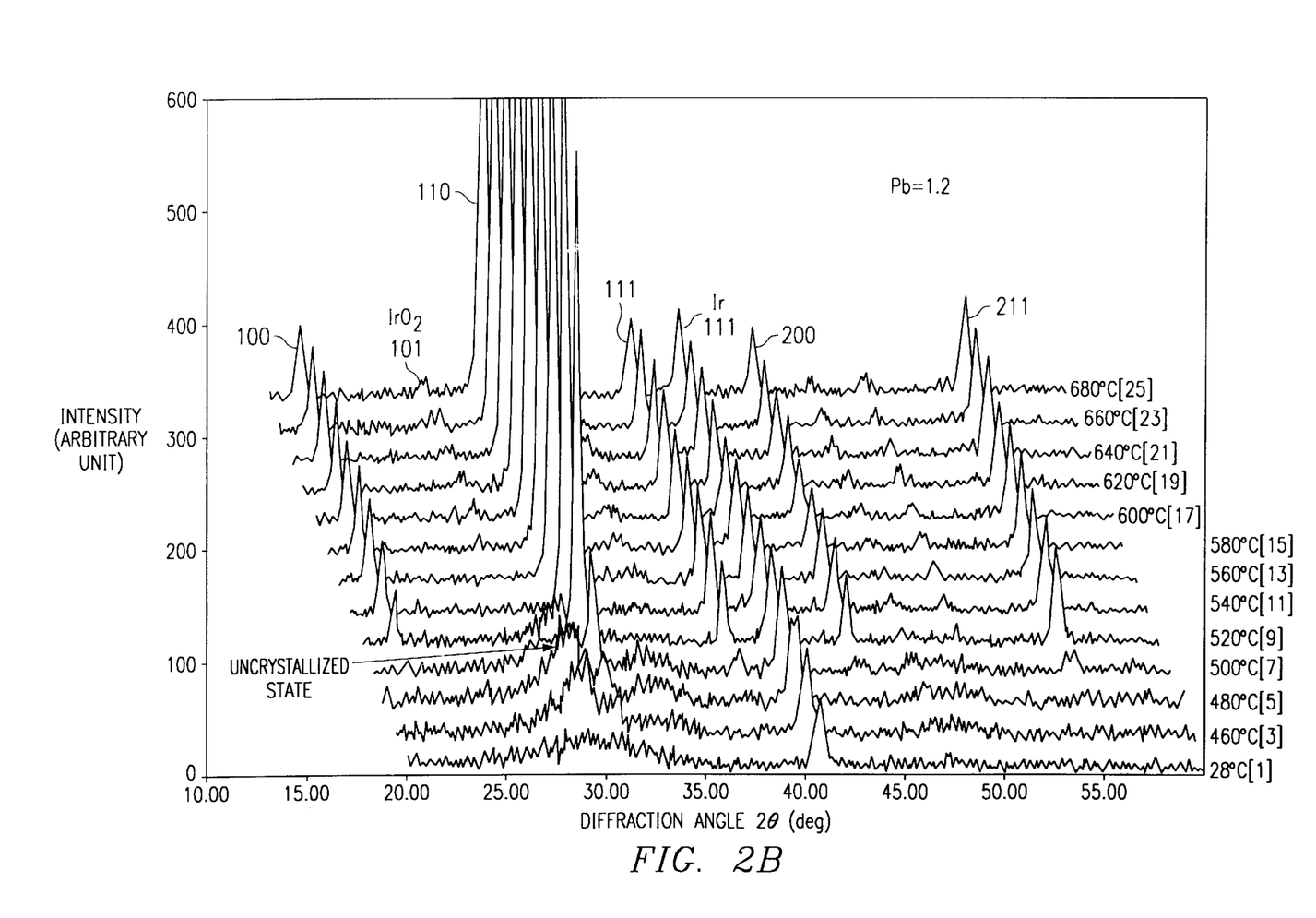
Figure 3:
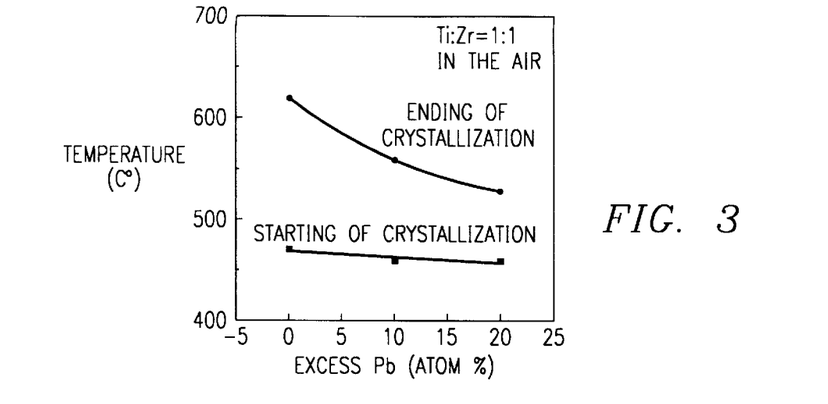
FIG. 3 is a diagram illustrating the crystallization starting and ending temperatures depending on the excess Pb in the PZT film.

First, the crystallization temperature of PZT will be explained. Changes in the diffraction patterns during the crystallization process are observed by means of XRD (X-ray diffraction) for a PZT film made of a solution of a stoichiometric composition (Pb=1.0) and another PZT film made of a solution containing excess pB (Pb=1.2). The results of the observation are shown in FIG. 2. FIG. 3 shows the relationships of the crystallization starting temperature and ending temperature with the amount of Pb derived from the changes in the X-ray diffraction pattern.

As can be seen from the results shown in FIGS. 2 and 3, when Pb=1.2 (that is, the number of atoms is 20% larger than the stoichiometric amount; the excess Pb is 20 atom %), the temperature for crystallization (formation of nuclei) settles at about 460° C. irrespective of the excess Pb. However, the crystallization ending temperature depends on the excess Pb. For the PZT film made of the stoichiometric composition (Pb=1.0), the crystallization ending temperature is 620° C. or higher. On the other hand, for the PZT film containing 20 atom % of excess pB (Pb=1.2), the crystallization is finished at 520° C. Consequently, if a solution containing excess pB is used, it becomes possible to lower the temperature for forming the film (to a temperature of 600° C. or below).

Figure 4A:
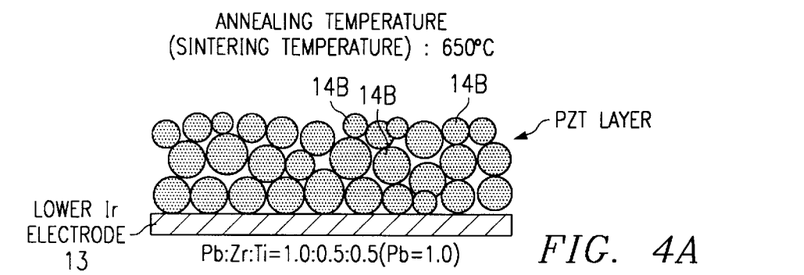
FIG. 4 is a schematic cross-sectional view comparing and illustrating various structures of the PZT capacitor obtained at different Pb concentrations and annealing temperatures.
Figure 4B:
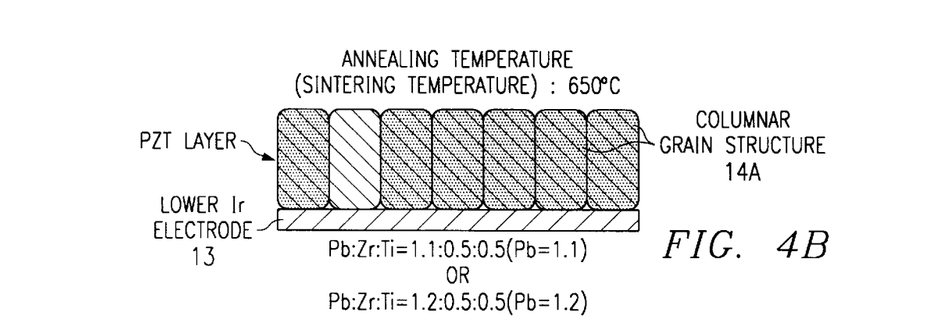
Figure 4C:
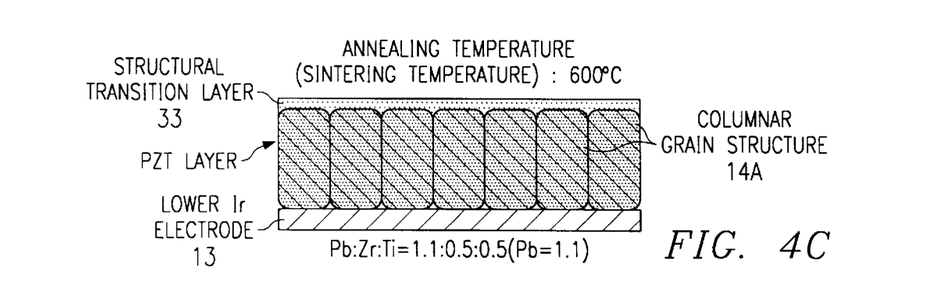
Figure 5A:
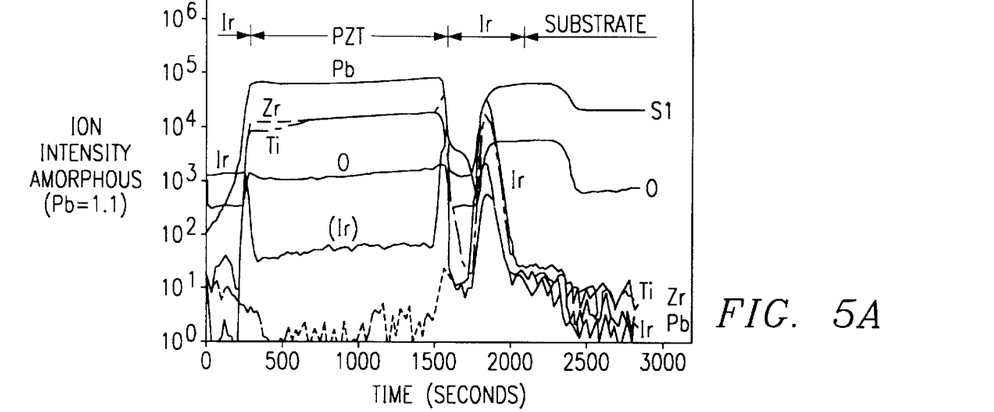
FIG. 5 is a diagram illustrating the profiles obtained using the SIMS method for PZT capacitors having PZT films formed at different temperatures and Pb concentrations.
Figure 5B:
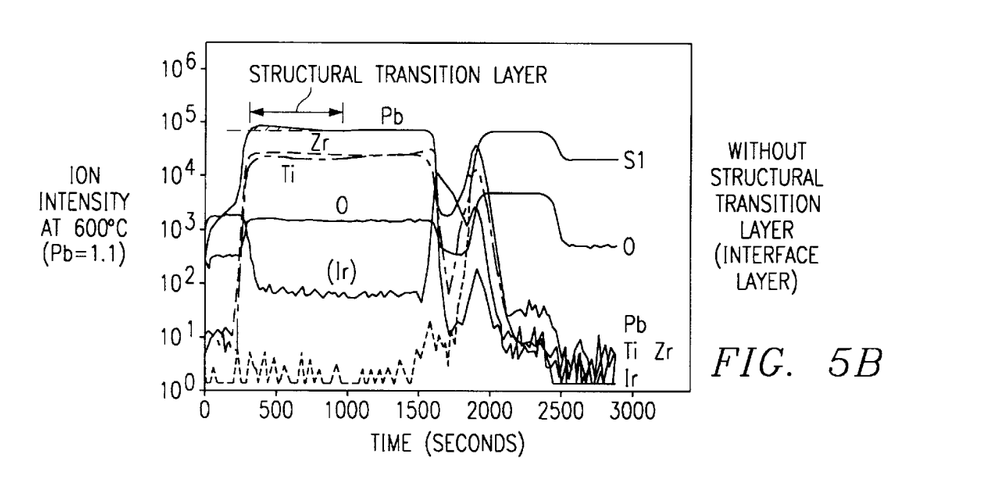
Figure 5C:
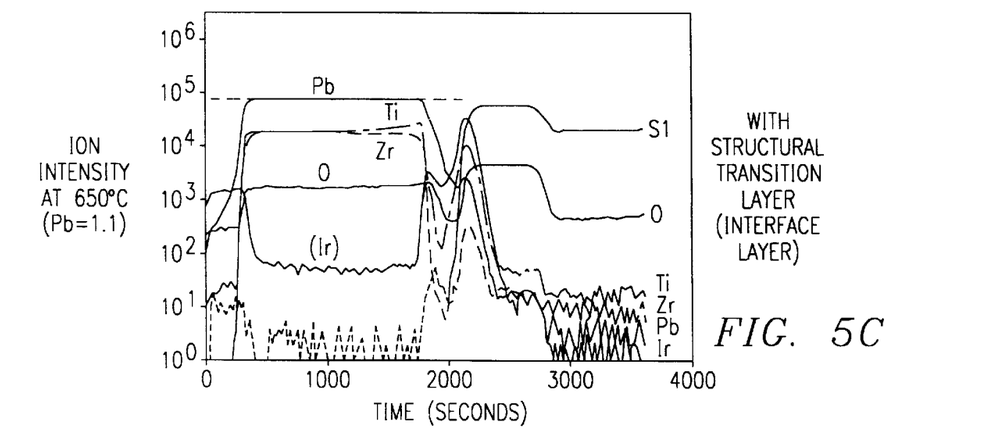

However, when a PZT film containing excess pB is formed at a low temperature below 600° C., a structural transition layer 33 is formed on the surface of PZT film 14 (Pb=1.1) as shown in FIG. 4(C). In order to remove this layer, it is necessary to perform a heat treatment at a temperature of 650° C. or higher as shown in FIG. 4(B). As can be seen from the depth profiles of secondary ion intensity measured by the SIMS method (secondary ion mass analysis) shown in FIG. 5, said surface layer 33 is made of excess pB and can be removed by a heat treatment performed at a temperature of 650° C. or higher. The surface layer is not formed in an amorphous state (before crystallization).

Figure 6:
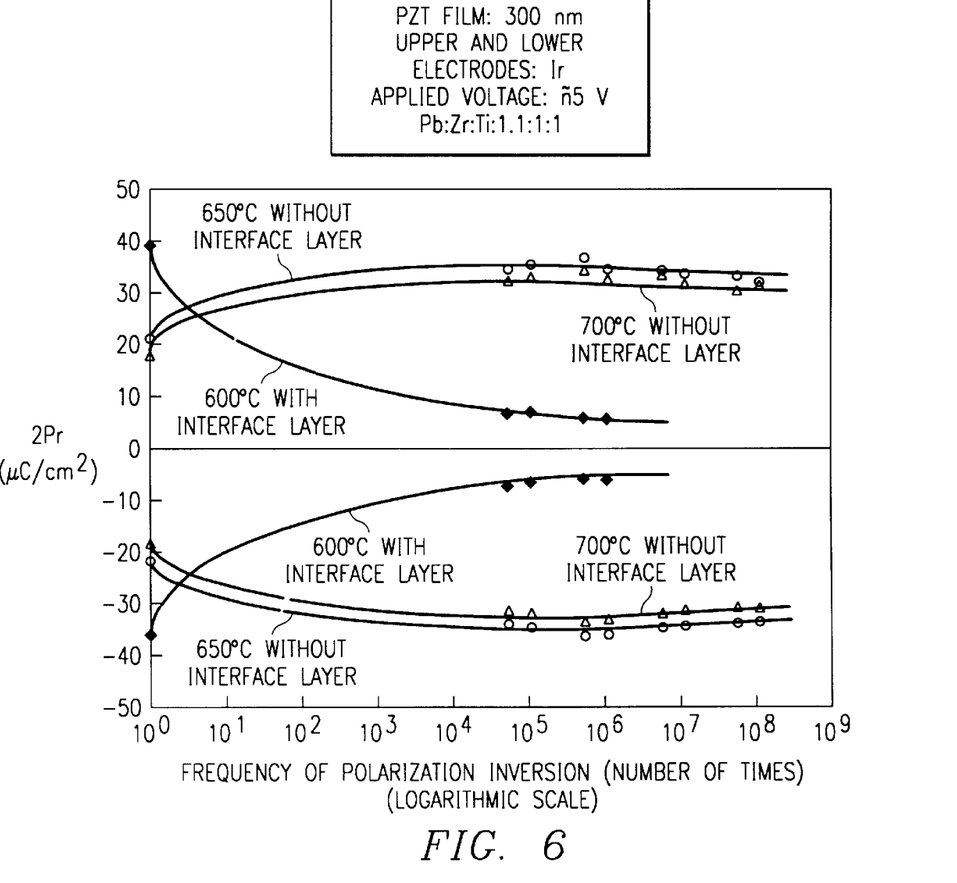
FIG. 6 is a diagram illustrating the relationship between the remnant polarization intensity and the frequency of the polarization inversion depending on the temperature of the heat treatment performed for the PZT capacitor.

As shown in FIG. 6, even when the temperature of the heat treatment during the crystallization process is lowered, if surface layer 33 is formed, the polarization intensity will drop significantly after repeated polarization inversions, and the polarization fatigue property and other characteristics concerned with the reliability cannot be satisfied. On the other hand, the capacitor shown in FIG. 4(B) with no structural transition layer on the surface has a high polarization intensity and displays a good antifatigue property. Consequently, it is clear that the polarization fatigue is caused by the transition layer.

According to the method proposed by the present inventors, a PZT film containing excess pB is crystallized at a low temperature of 600° C. or below, preferably 550° C. or below, and the structural transition layer formed on the surface is removed by means of dry etching. After that, an electrode is formed on the PZT film. In this way, the polarization fatigue characteristic property can be improved at the same time when the temperature is lowered.

When the PZT capacitor is formed using the method of this invention, it is desirable to satisfy the following conditions for the performance of the capacitor (especially for preventing polarization fatigue).

As far as the material of the electrode is concerned, Pt (in some cases, however, Au is used only for the upper electrode) or another substance that cannot be oxidized is used for the electrodes of the PZT capacitor. However, the polarization fatigue can be alleviated by using Ir metal for both the upper and lower electrodes. For example, in a capacitor using Au for the electrodes, the remnant polarization intensity is almost reduced to 0 after 1,000,000 or more inversions. In a capacitor using Pt for the upper electrode, while the fatigue characteristic property can be improved slightly, the polarization characteristics deteriorate significantly after $2\times10^6$ or more inversions. On the other hand, when Ir is used for the electrodes, the polarization characteristics do not deteriorate until the inversion is repeated $2\times10^9$ times.

In order to control the crystallization direction of the PZT, amorphous PZT is deposited on the lower electrode and is heated to a temperature higher than the crystallization temperature. As a result, the crystallization is carried out in the thickness direction. The columnar grain structure 14A is formed by the crystallization as shown in FIG. 4(C), and the excess lead is pressed out to the surface to form structural transition layer 33 mainly composed of Pb on the surface of PZT layer 14.

In the sol-gel method, the aforementioned crystallization only takes place when a PZT precursor solution containing excess pB is used. The reason is as follows. When the amount of Pb is the stoichiometric amount (Pb=1.0), since Pb flies away from the surface during crystallization, it is difficult to generate perovskite crystals in the upper portion of the PZT. On the other hand, in the case of excess pB, the Pb concentration on the surface can be maintained so that the crystallization can be carried out in the desired manner. There are three types of solution compositions that can be used in this case with Pb:Zr:Ti (ratio of number of atoms) as 1.0:0.5:0.5, 1.1:0.5:0.5, and 1.2:0.5:0.5, respectively. The fine structure of the PZT film formed on the lower Ir electrode 13 is shown in FIG. 4 as a sketch obtained from transmission electron microscopy TEM. A lump-shaped grain structure, a columnar structure, and another columnar structure are obtained corresponding to the aforementioned compositions, respectively.

When the Pb concentration of the precursor solution (or amorphous PZT) is low (Pb=1.0), as shown in FIG. 4(A), PZT film 14' is formed by lump-shaped aggregates of grains 14B. On the other hand, when the Pb concentration is in excess (Pb=1.0, preferably PB≧1.02, more preferably Pb>1.1, most preferably Pb=1.2) at the same sintering temperature (650° C.), a columnar grain structure (14A) is obtained.

A desirable composition of the PZT precursor solution is such that Pb=1.02–1.50, or preferably Pb=1.05–1.30, or more preferably Pb=1.10–1.20 (with respect to Zr+Ti=1.0) (the ratio Ti/Zr can be selected at will). If the Pb concentration is too low, it is difficult to form the aforementioned columnar structure (the PZT crystallization direction is difficult to control). On the other hand, if the Pb concentration is too high, the structural transition layer formed on the surface becomes too thick to be removed. As a result, contamination of the device tends to take place.

In this invention, the PZT is crystallized at a low sintering temperature (below 600° C.). As shown in FIG. 4(C), structural transition layer 33 is easy to form at such a low temperature. However, since the structural transition layer can be completely removed by means of dry etching (such as plasma etching and RIE etching) or wet etching, the polarization fatigue caused by structural transition layer 33 will not occur. In addition, the influence of the heat on the semiconductor substrate and wiring can be restrained by lowering the sintering temperature.

Application Examples

In the following, this invention will be explained in more detail with reference to embodiments.

FIGS. 1–14 show the first embodiment of this invention.

FIG. 1 is a diagram illustrating the process for forming a PZT capacitor using the method disclosed in this application example. In step 1, contact hole 19 is opened in insulating layer 1A, and an $SiO_2$ film is formed on a Si wafer. Polysilicon plug 20 is formed selectively in the contact hole using the photolithography technology. A TiN film with a thickness of 200 nm is formed as barrier layer 30 (barrier metal) on the insulating layer using the reactive sputtering method. Lower electrode 13 with a thickness of 200 nm and made of Ir (iridium) is formed on the buffer layer using the sputtering or electron beam heating deposition method. Amorphous PZT film 32 with a thickness in the range of 200–500 nm is formed as the material of the sol-gel method on said lower Ir electrode 13 using the spin coating method. In this case, the composition of the sol-gel solution is Pb:Ti:Zr=1.2:0.5:0.5 (ratio of number of atoms) with a 20 atom % excess pB concentration. The film-forming process is carried out in an oxidizing environment at a temperature in the range of 400–480° C.

Subsequently, a heat treatment is performed in step 2 for crystallizing the PZT. The temperature is set at the crystallization ending temperature derived from the observation of XRD (X-ray diffraction). For the solution containing 20 atom % excess pB, an appropriate crystallization ending temperature is in the range of 520–540° C., and the crystallization treatment is carried out in an oxidizing atmosphere. As a result of this treatment, PZT perovskite crystal 14 is formed. However, a structural transition layer 33 (surface layer or interface layer) containing excess pB is formed on the surface at the same time.

Subsequently, in step 3, structural transition layer 33 on the surface is removed by a dry etching method using ECR (electron cyclotron resonance). It is possible to adopt the reactive etching method using a gas mixture of Ar and $Cl_2$ as the etching gas (Ar flow rate: 10–20 SCCM, $Cl_2$ flow rate: 10–20 SCCM, reaction temperature: 0–100° C.) or the-sputtering etching method using Ar alone as the etching gas (Ar flow rate: 10–20 SCCM, temperature of the substrate: 0–100° C., discharge power: 100–400 W).

Subsequently, in step 4, the sputtering method or electron beam deposition method is used to form upper electrode 15 made of Ir, etc. on the surface of PZT 14 with said structural transition layer 33 removed.

Subsequently, in step 5, a fine processing is performed for PZT capacitor CAP by sequentially etching upper electrode 15, PZT 14, lower electrode 13, and barrier metal 30 in the same pattern. After that, insulating layer 1B made of a $SiO_2$-type substance is coated, and through hole 29 is opened in this insulating layer. Then, upper wiring 21 is formed.

In the following, the method for manufacturing a semiconductor device with the PZT capacitor obtained in the aforementioned embodiment incorporated, such as a FRAM memory cell (for example, a stack-type memory cell) known as a type of nonvolatile memory, will be explained with reference to FIGS. 7–14.

Figure 7:
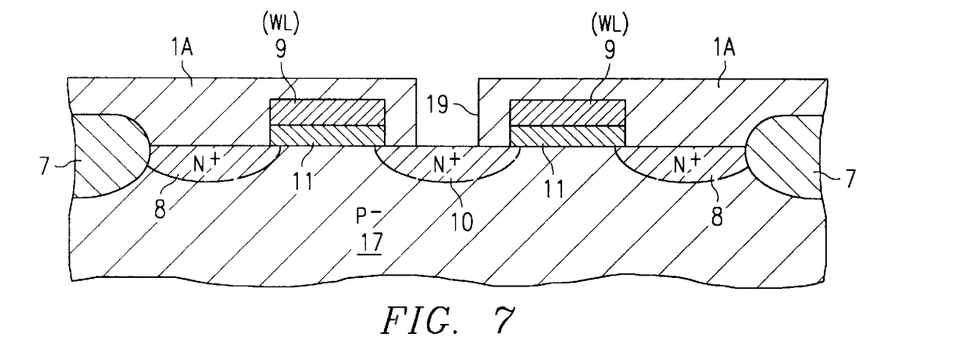
FIG. 7 is an enlarged cross-sectional view illustrating a step of the method for manufacturing a FRAM memory cell with a PZT capacitor incorporated according to this invention.

First, as shown in FIG. 7, field oxide film 7 is formed on p⁻-type silicon substrate (wafer) 17 using the selective oxidation method. Gate oxide film 11 and polysilicon work line 9 (WL) are formed using the hot oxidation method and the chemical vapor deposition method, respectively. Also, n⁺-type source region 10 and drain region 8 are formed by thermal diffusion of As or other N-type impurities.

Contact hole 19 is formed by means of photolithography on source region 10 in $SiO_2$ insulating layer 1A deposited on the whole surface using the chemical vapor deposition method.

Figure 8:
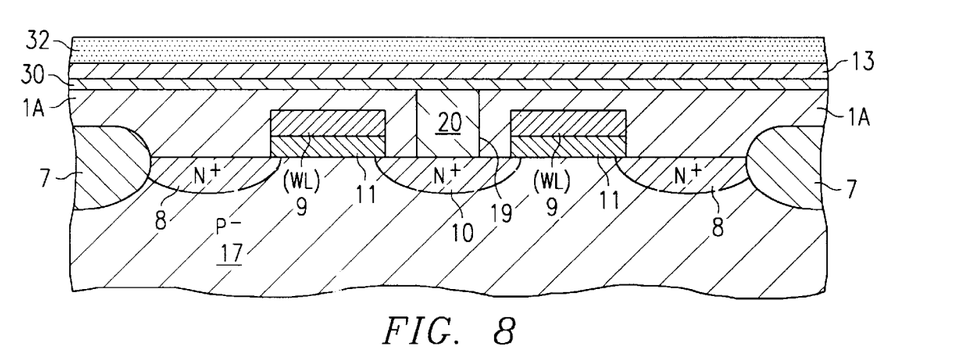
FIG. 8 is an enlarged cross-sectional view illustrating another step in the method for manufacturing the same memory cell.

Subsequently, as shown in FIG. 8, polysilicon plug 20, which is buried in contact hole 19 to come in contact with source region 10, is formed by coating. TiN barrier layer 30 and lower Ir electrode 13 are formed on the polysilicon plug. Then, said sol-gel feed solution 32A containing excess pB is coated on the whole surface using the spin coating method or dip coating method. After the wafer with the coated feed solution is heated at a prescribed temperature (in the range of 100–300° C., such as 170° C.) for 3 min, the coated solution is dried to form dry gel film 32B. Then, the dried wafer is treated at a temperature in the range of 400–480° C. to form an amorphous layer (32).

Figure 9:
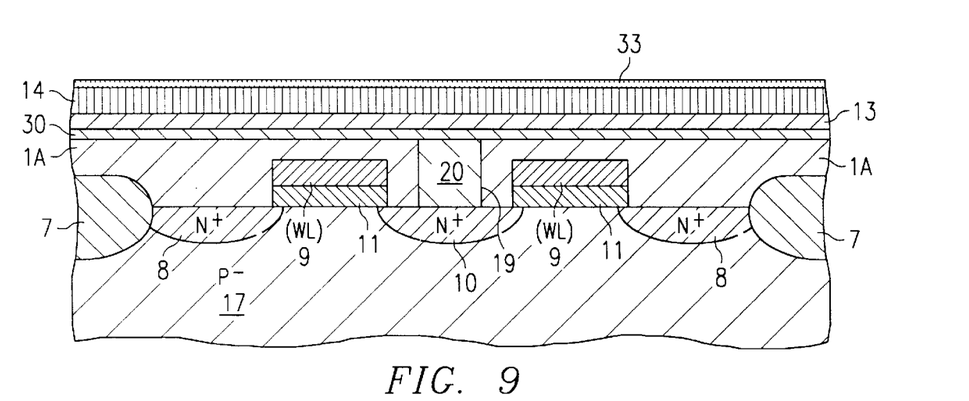
FIG. 9 is an enlarged cross-sectional view illustrating another step in the method for manufacturing the same memory cell.

Subsequently, the wafer is sintered (oxidation sintering) in the air at a low temperature (below 600° C., such as in the range of 520–540° C.) for 10 min under such conditions that the aforementioned columnar structure of the perovskite crystal can be formed. In this way, ferroelectric film 14 made of PZT perovskite crystal is formed over the whole surface as shown in FIG. 9. At this time, a structural transition layer 33 containing excess pB is formed on the surface of PZT film 14.

In order to form ferroelectric film 14 with the prescribed thickness (such as 2000 Å), the aforementioned coating step and drying step can be repeated if necessary. If the desired film thickness is not obtained by means of coating, dry films can be laminated to achieve the final film thickness.

Figure 10:
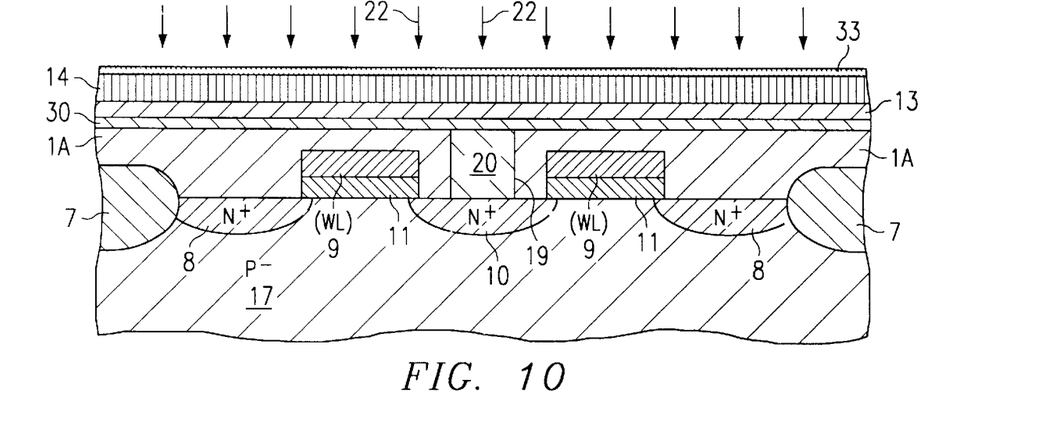
FIG. 10 is an enlarged cross-sectional view illustrating another step in the method for manufacturing the same memory cell.
Figure 11:
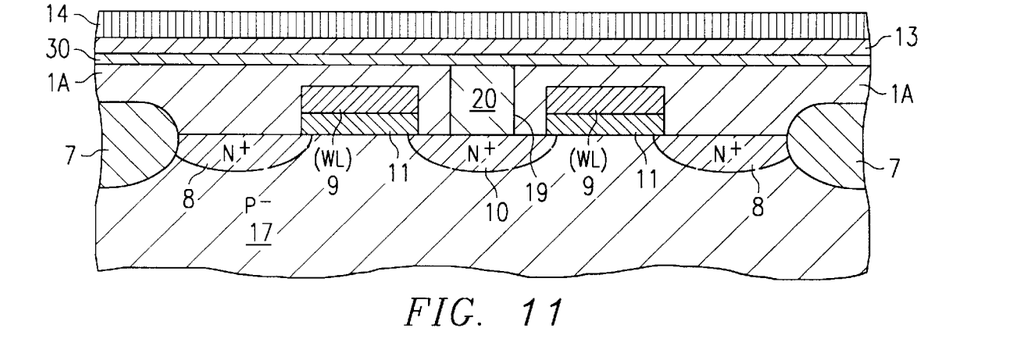
FIG. 11 is an enlarged cross-sectional view illustrating another step in the method for manufacturing the same memory cell.

Subsequently, as shown in FIG. 10, said structural transition layer 33 is removed by means of dry etching using plasma 22 to expose the surface of PZT film 14 as shown in FIG. 11.

Figure 12:
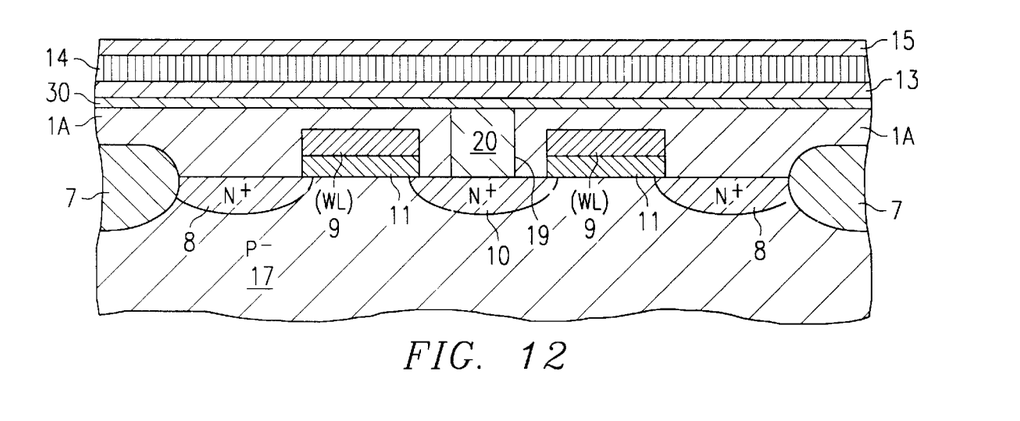
FIG. 12 is an enlarged cross-sectional view illustrating another step in the method for manufacturing the same memory cell.

Then, as shown in FIG. 12, iridium is coated by means of sputtering to form upper electrode 15 in a prescribed pattern.

Figure 13:
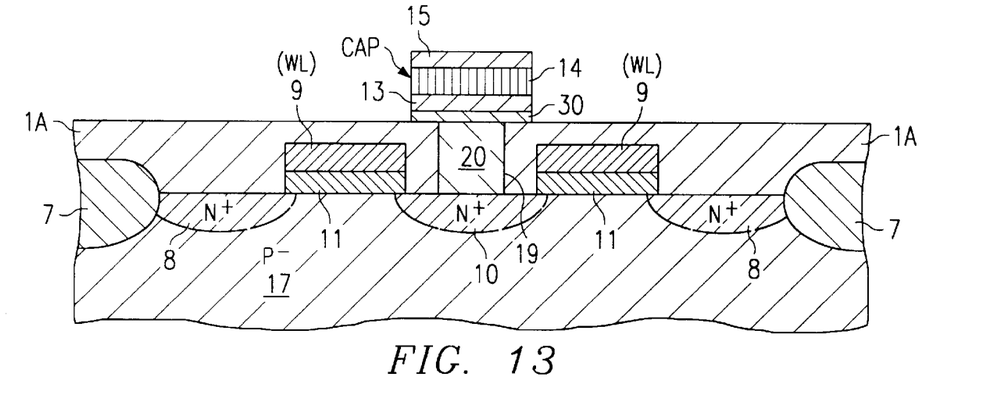
FIG. 13 is an enlarged cross-sectional view illustrating another step in the method for manufacturing the same memory cell.

Subsequently, as shown in FIG. 13, the unwanted portion of each film formed on the whole surface is removed using a dry etching method to form PZT capacitor CAP with barrier metal 30, lower electrode 13, PZT ferroelectric film 14 and upper electrode 15 laminated in the same pattern.

Figure 14:
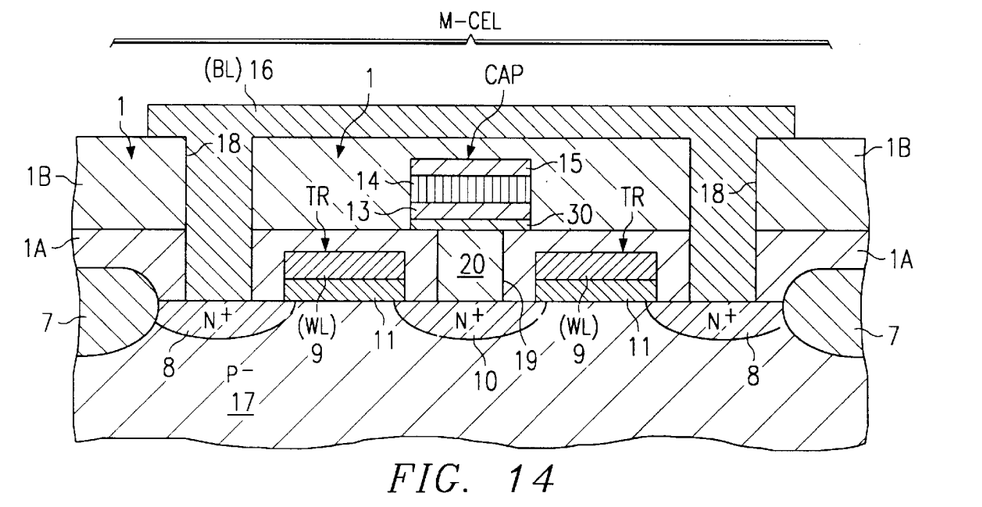
FIG. 14 is an enlarged cross-sectional view illustrating yet another step in the method for manufacturing the same memory cell.
Figure 15A:
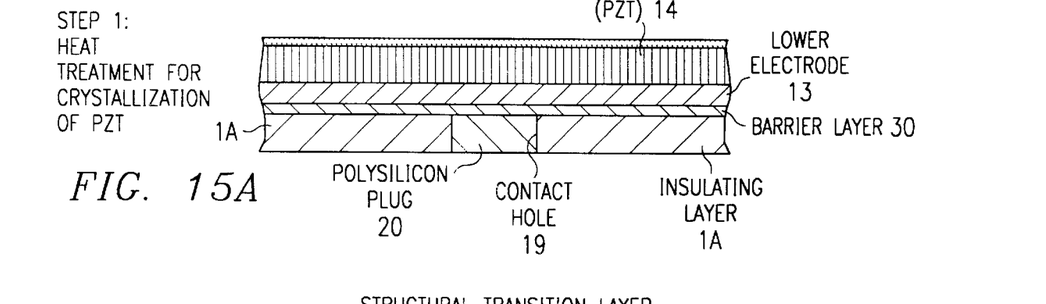
FIG. 15 is a schematic cross-sectional view illustrating the process for forming another PZT capacitor according to this invention.
Figure 15B:
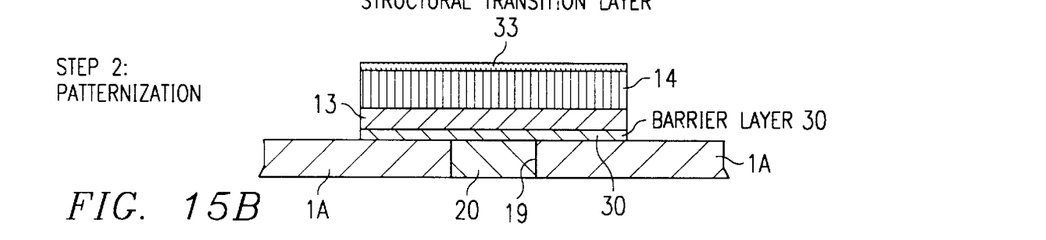
Figure 15C:
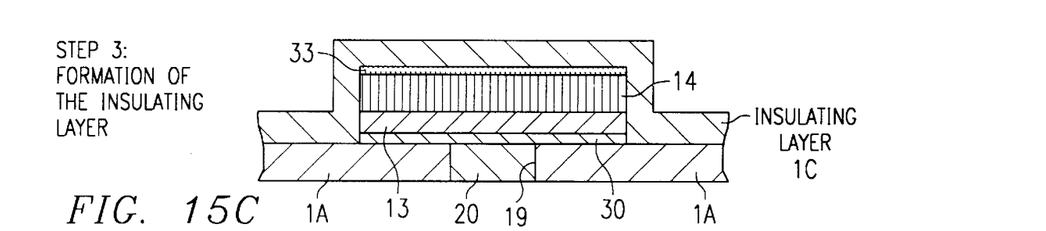
Figure 15D:
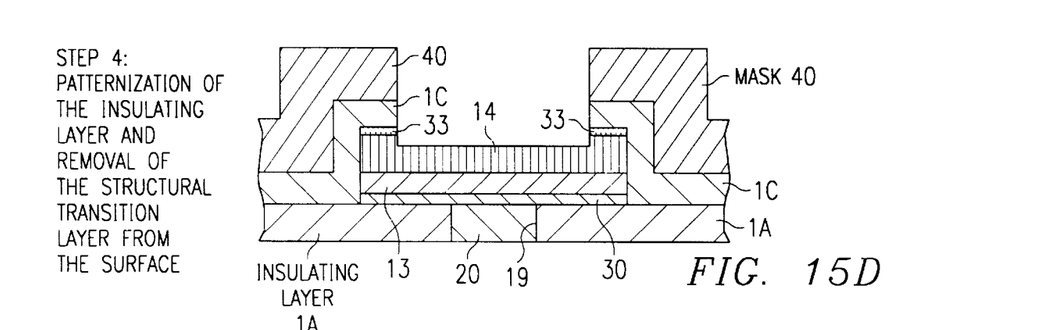
Figure 15E:
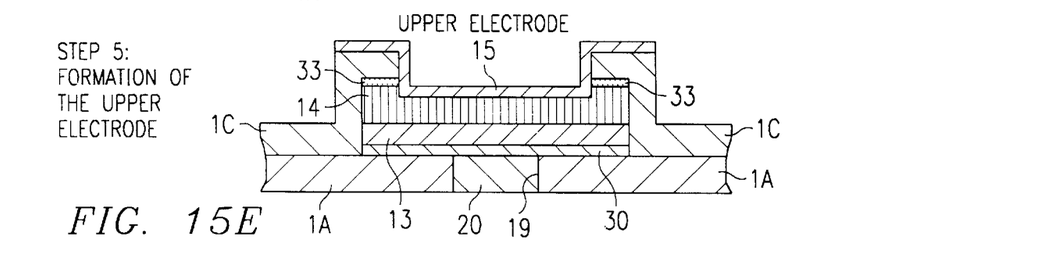

Subsequently, as shown in FIG. 14, interlayer insulating film 1B, contact hole 18, bit line 16 (BL) having a polysilicon plug (not shown in the figure) in its lower portion are formed to obtain memory cell M-CEL that can be used as a FRAM. The obtained memory cell is a CUB (cell under bitline) type memory cell. In transfer gate TR, polysilicon word line 9 (WL) is set via gate oxide film 11 between $N^{30}$ type source region 10 and $N^+$-type drain region 8. Bit line 16 (BL) is connected to drain region 8 through contact hole 18 of the insulating-layer made of $SiO_2$, etc. As shown in FIG. 1, upper electrode 15 of the capacitor is connected to wiring 21. FIG. 14 does not show said connection.

FIG. 15 shows the second embodiment of this invention.

This embodiment discloses a different method for forming a PZT capacitor from that disclosed in the first embodiment. In step I, a heat treatment is performed in the same way as step 2 in the first embodiment to crystallize the PZT. In this case, an appropriate crystallization ending temperature for the solution containing 20 atom % excess pB is also in the range of 520–540° C., and the heat treatment for crystallization is performed in an oxidizing atmosphere. As a result of this treatment, PZT perovskite crystal 14 is formed. However, a structural transition layer (surface layer or interface layer) 33 containing excess pB is formed on the surface at the same time.

Subsequently, in step II, films 33, 14, 13, and 30 are laminated and etched in the same pattern. In step III, insulating layer 1C made of $SiO_2$ is coated using the CVD (chemical vapor deposition) method.

Subsequently, in step IV, photoresist 40, which has experienced pattern exposure and developing treatment, is used as a common mask to partially remove structural transition layer 33 on the surface together with insulating layer 1C (the surface of PZT 14 is also removed) by the dry etching method using ECR (electron cyclotron resonance). It is possible to adopt the reactive etching method using a gas mixture of Ar and $Cl_2$ as the etching gas (Ar flow rate: 0–20 SCCM, $Cl_2$ flow rate: 10–20 SCCM, reaction temperature: 10–100° C.) or the sputtering etching method using Ar alone as the etching gas (Ar flow rate: 10–20 SCCM, temperature of the substrate: 0–100° C., discharge power: 100–400 W).

Subsequently, in step V, the sputtering method or electron beam deposition method is used to form upper electrode 15 made of Ir, etc., on the surface of PZT 14 with part of structural transition layer 33 removed. As shown in the figure, upper electrode 15 is also coated on insulating layer 1C. However, the upper electrode can be patterned by etching.

By using the method disclosed in this application example, the crystal can grow at a low temperature and the polarization characteristics can be improved in the same way as described in the first embodiment. At the same time, as described in step IV, since structural transition layer 33 can also be removed using a common mask 40 (that is, self-alignment) when etching is performed for contact of the upper electrode, there is no need to perform two separate steps like steps 3 and 5 in the first application example. It is also possible to remove only part of structural transition layer 33 when it is difficult to remove structural transition layer 33 on the whole surface by means of etching (step 3 in the first application example). Consequently, the manufacturing process is simplified, and the step including etching can be carried out more easily.

The embodiments of this invention are explained above. However, the aforementioned embodiments can be modified based on the technical ideas of this invention.

Figure 16:
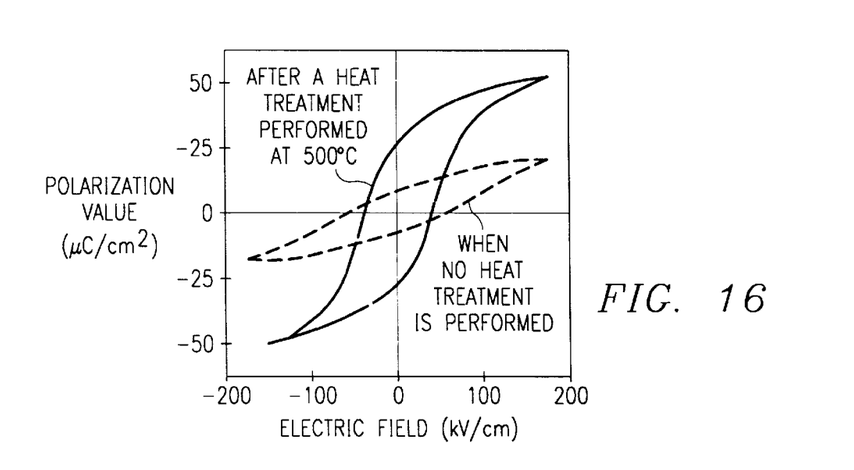
FIG. 16 is a hysteresis curve diagram comparing and illustrating polarization characteristics when a heat treatment is performed or not performed after the structural transition layer is removed.

For example, PZT might be damaged when structural transition layer 33 is removed by dry etching. As a result, the characteristics might deteriorate. The characteristics can be recovered as shown in FIG. 16 by performing a heat treatment at a temperature in the range of 400–700° C. (such as 500° C.). Consequently, it is advantageous to add this heat treatment. If the temperature of this heat treatment is too high, the barrier metal will be oxidized, increasing the resistance. It is preferred that the heat treatment be performed at 400–550° C. The characteristics of PZT can be fully recovered at a temperature around 500° C.

In addition to the aforementioned dry etching method, it is also possible to use a chemical dissolution method to remove structural transition layer 33. In this case, a $SiO_2$ film is deposited on the structural transition layer using the sputtering method. Then, a heat treatment is performed at about 500° C. to vitrify the $SiO_2$—PbO system with a low melting point. After that, the $SiO_2$—PbO system is chemically dissolved with HF, etc.

In addition to the sol-gel method, it is also possible to use the sputtering method, CVD method, deposition method, or laser ablation method as the method for forming the amorphous PZT film containing excess pB (referring to said step 1).

In addition to Ir, it is also possible to use $IrO_2$, Ru, $RuO_2$, Pt, Pd, etc., as the material of the electrode. For PZT, the Ti/Zr ratio can be selected at will in the composition containing excess pB. The excess Pb should be in the range of 2–50 atom %, or preferably in the range of 5–50 atom % with respect to the stoichiometric composition. In addition to the aforementioned PZT, it is also possible to use PLT ((Pb, La)×(Ti, Zr)$_{1-x}$O$_3$) or other types of PZT prepared by adding Nb, Zr, Fe, etc., to the aforementioned PZT as the material of the ferroelectric film.

The ferroelectric film of this invention can be used for the devices having a capacitor (stack-type capacitor) with the structure of Ir/PZT/Ir/barrier layer/polysilicon shown in FIG. 1 or 14. It is also possible to use the ferroelectric film of this invention for a device in which the aforementioned stack-type capacitor is set on a SiO$_2$ film and the lower electrode of this capacitor is extended to be connected to the source region of the transfer gate, or for a nonstack-type capacitor which is assembled in a trench (groove). The ferroelectric film of this invention can also be used in fields other than FRAM. In addition, the ferroelectric film of this invention can be used for COB (cell over bitline) type memory cells.

Effects of this Invention

As explained above, according to this invention, a ferroelectric material layer, such as an amorphous layer made of lead zirconate titanate and containing excess lead, is formed on the aforementioned first electrode. The ferroelectric material is crystallized by a heat treatment to form the aforementioned ferroelectric film. An appropriate treatment is performed to remove the surface deposit, such as the aforementioned structural transition layer containing excess pB, which is mainly composed of the aforementioned specific constituent element and is generated on the surface of the aforementioned ferroelectric film during the crystallization process. Therefore, even when the aforementioned heat treatment is performed at a low temperature (especially 600° C. or below), the aforementioned surface deposit can be removed by this heat treatment. Consequently, the deterioration in the polarization characteristics caused by the surface deposit can be prevented. By using the material layer containing excess pB or other specific constituent element, the crystallization is carried out in the desired direction. As a result, a ferroelectric film with good polarization inversion characteristics can be obtained.

Since the heat treatment can be performed at a low temperature, the influence of the heat on the element region and wiring of the semiconductor substrate is restrained. For example, it is possible to prevent the change in the concentration of the impurities and the damage of Al wiring.

Explanation of Symbols

What is claimed is:

1. A method for manufacturing a ferroelectric capacitor with a ferroelectric film and a second electrode laminated sequentially on a first electrode comprising the following steps:

forming a PZT layer containing an excess amount of lead on the first electrode;

crystallizing the PZT layer by heat treatment at a temperature of no more than substantially 600° C. to form the ferroelectric film, said crystallizing step forming a structural transition layer on a surface of said crystallized PZT; and removing the structural transition layer.

2. The method described in claim 1, wherein:

the ferroelectric capacitor is formed by sequentially laminating a lead zirconate titanate layer on a lower electrode made of iridium, iridium oxide, rubidium, rubidium oxide, platinum, or palladium and then forming an upper electrode made of iridium, iridium oxide, rubidium, rubidium oxide, platinum or palladium by the following steps:

first forming an amorphous layer of lead zirconate titanate containing an excess amount of lead on the lower electrode;

then, the amorphous layer is crystallized by a heat treatment to form a crystal layer of lead zirconate titanate;

after that, the surface deposit mainly composed of the excess lead and generated on the surface of the crystal layer during the crystallization process is removed by means of etching or dissolution;

after the surface deposit is removed, the upper electrode is formed on the exposed crystal layer.

3. The method described in claim 2, wherein the etching is a dry etching operation, and the dissolution is a chemical dissolution carried out after the surface deposit is vitrified.

4. The method described in claim 2, wherein lead content in the amorphous layer of lead zirconate titanate is 1.02–1.50 times (in the ratio of number of atoms) as much as the total amount of zirconium and titanium.

5. A method for manufacturing a ferroelectric capacitor by sequentially laminating a ferroelectric film and a second electrode on a first electrode comprising the following steps:

forming a PZT ferroelectric material layer containing an excess amount of lead on the first electrode;

crystallizing the ferroelectric material by heat treatment at a temperature of no more than substantially 600° C. to form the ferroelectric film;

forming an insulating layer on the surface including the surface deposit mainly composed of lead and generated on the surface of the ferroelectric film during the crystallization process; and removing the prescribed portions of the insulating layer, followed by removing the surface deposit right below the removed portions to expose part of the ferroelectric film.

6. The method described in claim 5, wherein:

the ferroelectric capacitor is formed by sequentially laminating a lead zirconate titanate layer on a lower electrode made of iridium, iridium oxide, rubidium, rubidium oxide, platinum, or palladium and then forming an upper electrode made of iridium, iridium oxide, rubidium, rubidium oxide, platinum or palladium by the following steps:

first an amorphous layer of lead zirconate titanate containing an excess amount of lead is formed on the lower electrode;

then, the amorphous layer is crystallized by a heat treatment to form a crystal layer of lead zirconate titanate;

after that, the prescribed portions of the insulating layer, which is formed on the surface including the surface deposit mainly composed of the excess lead and generated on the surface of the crystal layer during the crystallization process, and the surface deposit right below the prescribed portions are removed by means of etching or dissolution using a common mask;

finally, the upper electrode is formed on the exposed crystal layer.

7. The method described in claim 6, wherein etching is a dry etching operation, and the dissolution is a chemical dissolution carried out after the surface deposit is vitrified.

8. The method described in claim 6, wherein the lead content in the amorphous layer of lead zirconate titanate is 1.02–1.50 times (in the ratio of number of atoms) as much as the total amount of zirconium and titanium.

9. The method described in claim 3 wherein a heat treatment is carried out at 400–700° C. after the deposit is dry-etched.

10. The method described in claim 1 wherein the ferroelectric capacitor is part of a ferroelectric memory device.

11. The method described in claim 2 wherein the ferroelectric capacitor is part of a ferroelectric memory device.

12. The method described in claim 3 wherein the ferroelectric capacitor is part of a ferroelectric memory device.

13. The method described in claim 4 wherein the ferroelectric capacitor is part of a ferroelectric memory device.

14. The method described in claim 5 wherein the ferroelectric capacitor is part of a ferroelectric memory device.

15. The method described in claim 6 wherein the ferroelectric capacitor is part of a ferroelectric memory device.

16. The method described in claim 7 wherein the ferroelectric capacitor is part of a ferroelectric memory device.

17. The method described in claim 8 wherein the ferroelectric capacitor is part of a ferroelectric memory device.

18. The method described in claim 9 wherein the ferroelectric capacitor is part of a ferroelectric memory device.

19. The method described in claim 7 wherein a heat treatment is carried out at 400–700° C. after the deposit is dry-etched.

* * * * *